US012736576B2

(12) United States Patent
Xia et al.

(10) Patent No.: US 12,736,576 B2
(45) Date of Patent: Sep. 15, 2026

(54) DISCONNECTION POINT DETECTION METHOD FOR SINGLE-WIRE SERIES CIRCUITS, SINGLE-WIRE SERIES CIRCUIT, AND DRIVER ARCHITECTURE

(71) Applicants: HUAYUAN SEMICONDUCTOR (SHENZHEN) LIMITED COMPANY, Shenzhen (CN); Huayuan Semiconductor (Tianjin) Limited Company, Tianjin (CN)

(72) Inventors: Lei Xia, Shenzhen (CN); Junyue Sun, Shenzhen (CN); Haiming Yu, Shenzhen (CN); Yuanlei Wang, Shenzhen (CN); Zhangyi Zhu, Shenzhen (CN)

(73) Assignees: HUAYUAN SEMICONDUCTOR (SHENZHEN) LIMITED COMPANY, Shenzhen (CN); Huayuan Semiconductor (Tianjin) Limited Company, Tianjin (CN)

( * ) Notice: Subject to any disclaimer, the term of this patent is extended or adjusted under 35 U.S.C. 154(b) by 0 days.

(21) Appl. No.: 19/183,964

(22) Filed: Apr. 21, 2025

(65) Prior Publication Data

US 2025/0264550 A1 Aug. 21, 2025

(30) Foreign Application Priority Data

Feb. 21, 2024 (CN) ........................ 202410193548.6

(51) Int. Cl.
*G01R 31/08* (2020.01)
*G01R 31/52* (2020.01)
(Continued)

(52) U.S. Cl.
CPC ............ *G01R 31/08* (2013.01); *G01R 31/52* (2020.01); *G01R 31/54* (2020.01); *G09G 3/006* (2013.01)

(58) Field of Classification Search
CPC ........ G01R 31/08; G01R 31/52; G01R 31/54; G01R 31/58; G09G 3/006
(Continued)

(56) References Cited

U.S. PATENT DOCUMENTS 10,909,911 B1 * 2/2021 Zheng ...................... G09G 3/32
12,610,438 B2 * 4/2026 Liu ....................... H05B 45/30
(Continued)

*Primary Examiner* — William Hernandez

(57) ABSTRACT

The present application provides a disconnection point detection method for single-wire series circuits, a single-wire series circuit, and a driver architecture. The method utilizes the existing parallel bus structure of the single-wire series circuit to detect disconnection points. Specifically, the position of the final short-circuit disconnection point is determined using the first correction command and the second address-assignment information, while the position of the final open-circuit disconnection point is determined using the second and third correction commands along with the third address-assignment information. The present application eliminates the need to add additional backup pins to each driver unit, thereby reducing the packaging cost of the single-wire series circuit and significantly lowering the packaging cost of the driver architecture. Furthermore, since the single-wire series circuit does not require routing for extra backup pins, the wiring complexity of the driver architecture is greatly simplified, leading to a reduction in PCB costs.

12 Claims, 5 Drawing Sheets

(51) Int. Cl.
*G01R 31/54* (2020.01)
*G09G 3/00* (2006.01)

(58) Field of Classification Search
USPC .......................................... 324/512; 327/108
See application file for complete search history.

(56) References Cited

U.S. PATENT DOCUMENTS

| | | | | |
|---|---|---|---|---|
| 2013/0313973 | A1* | 11/2013 | DeNicholas et al. .. | H05B 45/10<br>307/115 |
| 2021/0366369 | A1* | 11/2021 | Wei ........................... | G01J 1/44 |
| 2021/0366391 | A1* | 11/2021 | Wei ........................... | G01J 1/44 |
| 2022/0020310 | A1* | 1/2022 | Gray ........................ | G09G 3/32 |
| 2025/0024573 | A1* | 1/2025 | Miura .................... | H05B 45/52 |

* cited by examiner

DISCONNECTION POINT DETECTION METHOD FOR SINGLE-WIRE SERIES CIRCUITS, SINGLE-WIRE SERIES CIRCUIT, AND DRIVER ARCHITECTURE

CROSS REFERENCE TO RELATED APPLICATIONS

The present claims the benefit of Chinese Patent Application No. 202410193548.6 filed on Feb. 21, 2024, the contents of which are incorporated herein by reference in their entirety.

TECHNICAL FIELD

The present application relates to the field of display technology, and more specifically, to a disconnection point detection method for single-wire series circuits, a single-wire series circuit, and a driver architecture.

BACKGROUND

With the development of display technology, Mini LED backlight technology has been increasingly applied in liquid crystal display (LCD) systems. A typical driver architecture is shown in FIG. 1, where the master control module controls multiple sub-control modules; each sub-control module controls multiple rows of driver links. Each row of driver links is composed of multiple driver chips connected in series, with each driver chip driving the corresponding LED chip.

Under the same conditions, the more driver chips in the driver architecture, the better the display effect of the display system. In current LCD displays, the number of driver chips in the driver architecture has increased from hundreds to thousands, or even tens of thousands. As the number of driver chips in the driver architecture continues to grow, the probability of a disconnection point occurring in the driver link also increases. Since the communication method of the driver link is serial communication, once a disconnection point occurs on the link, the link will fail to function properly, which can severely impact the user's experience and lead to the product being returned for repair. Therefore, addressing the issue of disconnection points in the driver link is critical.

Manufacturers diagnose whether any disconnection points exist in each driver link before the display is shipped to ensure the proper serial communication of the driver architecture. However, over time, as the display is used, the internal driver links may develop disconnection points due to aging or other factors.

In solving this issue, the prior art typically employs a jumper solution, as illustrated in FIG. 2. This solution adds a backup pin to each driver chip and connects the backup pin to the input terminal of the previous driver chip. When a disconnection point occurs at the output terminal of a driver chip, a specific judgment condition allows the adjacent subsequent driver chip to connect to the input terminal of the affected driver chip through the backup pin to receive the addressing command, enabling normal communication of the subsequent driver chip. The problems with the jumper solution are as follows:

1. Each driver chip adds a backup pin, increasing the packaging cost of each driver chip, which significantly raises the overall packaging cost of the driver architecture.

2. Additional circuit lines are added to the PCB, increasing line costs and making it prone to crossover routing.

Therefore, providing a low-cost disconnection point detection method has become a technical issue that urgently needs to be addressed in the industry.

SUMMARY OF THE INVENTION

To solve the above-mentioned technical problems, the present application provides a disconnection point detection method for single-wire series circuits, a single-wire series circuit, and a driver architecture.

According to a first aspect of the present application, a disconnection point detection method for single-wire series circuits is provided, which is used to detect the presence of disconnection points in a single-wire series circuit; wherein the single-wire series circuit includes a main control unit and N driver units, and the N driver units are connected in series; an output terminal of the main control unit is connected to an input terminal of the first driver unit, an output terminal of the N-th driver unit is connected to an input terminal of the main control unit, and a signal terminal of the main control unit is connected to each of the driver units; wherein N is a positive integer and N≥1;

the method includes the following steps:

assigning addresses to the N driver units connected in series;

determining whether the main control unit receives expected address-assignment information within a first time period; if yes, it is determined that no disconnection point fault exists in the single-wire series circuit; if no, it is determined that a disconnection point fault exists in the single-wire series circuit, and a first correction command is output to the N driver units to identify the first driver unit after each short-circuit disconnection point; setting the first driver unit at each short-circuit disconnection point to a first state and setting addresses to the address of the first driver unit via the first correction command, and controlling the driver units in the first state to output an address-assignment command; wherein the expected address-assignment information is configured to represent sequential address-assignment information from the first driver unit to the N-th driver unit;

determining whether the main control unit receives second address-assignment information within a second time period; if the second address-assignment information is received, determining a position of a final short-circuit disconnection point based on the second address-assignment information; wherein the second address-assignment information is configured to represent sequential address-assignment information from the first driver unit to the N-th driver unit at the final short-circuit disconnection point;

if the second address-assignment information is not received, the single-wire series circuit does not have a short-circuit disconnection point fault, and a second correction command and a third correction command are output to the N driver units to collectively identify the first driver unit after each open-circuit disconnection point; setting the first driver unit after each open-circuit disconnection point to a second state and setting addresses to the address of the first driver unit via the third correction command, and controlling the driver units in the second state to output the address-assignment command;

determining whether the main control unit receives third address-assignment information within a third time period; if the third address-assignment information is received, determining a position of a final open-circuit disconnection point based on the third address-assignment information; wherein the third address-assignment information is configured to represent sequential address-assignment information from the first driver unit to the N-th driver unit at the final open-circuit disconnection point; and if the third address-assignment information is not received, a system outputs a warning signal, indicating that multiple faults exist in the system.

Optionally, before the main control unit addresses the N driver units, the method further includes: powering on the single-wire series circuit and sending a correction command via a parallel bus to realize disconnection point repair.

Optionally, the step of determining a position of a final short-circuit disconnection point based on the second address-assignment information includes:

subtracting the address-assignment information in the second address-assignment information from the address-assignment information in the expected address-assignment information to obtain a first position; and determining a specific position of the final short-circuit disconnection point based on the first position.

Optionally, after the step of determining a position of a final short-circuit disconnection point based on the second address-assignment information, the method further includes:

sequentially addressing subsequent driver units at the final short-circuit disconnection point according to the expected address-assignment information, based on the position of the final short-circuit disconnection point and an address-assignment information difference between adjacent driver units.

Optionally, the step of sequentially addressing the subsequent driver units at the final short-circuit disconnection point according to the expected address-assignment information, based on the position of the final short-circuit disconnection point and an address-assignment information difference between adjacent driver units specifically includes:

obtaining a fourth correction command based on the position of the final short-circuit disconnection point and the address-assignment information difference between adjacent driver units, and outputting it to N driver units; wherein the fourth correction command is configured to address the driver unit in the first state according to the expected address-assignment information of the first driver unit at the final short-circuit disconnection point; and controlling the driver unit in the first state to output the address-assignment command to sequentially address the subsequent driver units.

Optionally, the step of determining a position of a final open-circuit disconnection point based on the third address-assignment information includes:

subtracting the address-assignment information in the third address-assignment information from the address-assignment information in the expected address-assignment information to obtain a second position; and determining a specific position of the final open-circuit disconnection point based on the second position.

Optionally, after the step of determining a position of a final open-circuit disconnection point based on the third address-assignment information, the method further includes:

sequentially addressing subsequent driver units at the final open-circuit disconnection point according to the expected address-assignment information, based on the position of the final open-circuit disconnection point and an address-assignment information difference between adjacent driver units.

Optionally, the step of sequentially addressing the subsequent driver units at the final open-circuit disconnection point according to the expected address-assignment information, based on the position of the final open-circuit disconnection point and an address-assignment information difference between adjacent driver units specifically includes:

obtaining a fifth correction command based on the position of the final open-circuit disconnection point and the address-assignment information difference between adjacent driver units, and outputting it to N driver units; wherein the fifth correction command is configured to address the driver unit in the second state according to the expected address-assignment information of the first driver unit at the final open-circuit disconnection point; and controlling the driver unit in the second state to output the address-assignment command to sequentially address the subsequent driver units.

Optionally, if the expected address-assignment information is received, a state-clear command is sent to the N driver units to clear the first state of the driver unit and clear the second state of the driver unit; if the expected address-assignment information is not received, the warning signal is output externally.

According to a second aspect of the present application, a single-wire series circuit is provided, which includes:

a main control unit and N driver units, and the N driver units connected in series; an output terminal of the main control unit is connected to an input terminal of the first driver unit, an output terminal of the N-th driver unit is connected to an input terminal of the main control unit, and a parallel signal terminal of the main control unit is connected to each of the driver units; where N is a positive integer and N≥1; wherein, the main control unit is configured for:

assigning addresses to the N driver units connected in series;

determining whether the main control unit receives expected address-assignment information within a first time period; if yes, it is determined that no disconnection point fault exists in the single-wire series circuit; if no, it is determined that a disconnection point fault exists in the single-wire series circuit, and a first correction command is output to the N driver units to identify the first driver unit after each short-circuit disconnection point; setting the first driver unit at each short-circuit disconnection point to a first state and setting addresses to the address of the first driver unit via the first correction command, and controlling the driver units in the first state to output an address-assignment command; wherein the expected address-assignment information is configured to represent address-assignment information from the first driver unit to the N-th driver unit;

determining whether the main control unit receives second address-assignment information within a second time period; if the second address-assignment information is received, determining a position of a final short-circuit disconnection point based on the second address-assignment information; wherein the second address-assignment information is configured to represent address-assignment information from the first driver unit to the N-th driver unit at the final short-circuit disconnection point;

if the second address-assignment information is not received, a second correction command and a third correction command are output to the N driver units to collectively identify the first driver unit after each open-circuit disconnection point; setting the first driver unit after each open-circuit disconnection point to a second state and setting addresses to the address of the first driver unit via the third correction command, and controlling the driver units in the second state to output the address-assignment command;

determining whether the main control unit receives third address-assignment information within a third time period; if the third address-assignment information is received, determining a position of a final open-circuit disconnection point based on the third address-assignment information; wherein the third address-assignment information is configured to represent sequential address-assignment information from the first driver unit to the N-th driver unit at the final open-circuit disconnection point; and if the third address-assignment information is not received, a system outputs a warning signal.

According to a third aspect of the present application, a driver architecture is provided, which includes M single-wire series circuits of claim 10; wherein M is a positive integer and M≥1.

The present application provides the disconnection point detection method for single-wire series circuits, single-wire series circuit, and driver architecture. The method adopts a parallel bus structure in the Serial and Parallel Broadcast Communication Protocol (SPB protocol) to detect disconnection points in serial circuits. Compared to existing solutions for detecting disconnection points in single-wire series circuits, the present application does not require the addition of backup pins on each driver unit, which reduces the packaging cost of the single-wire series circuit and significantly lowers the overall packaging cost of the driver architecture. Additionally, the application eliminates the need for routing extra backup pins, greatly simplifying the routing of the driver architecture and reducing PCB costs.

BRIEF DESCRIPTION OF THE DRAWINGS

The present application will be further explained in detail with reference to the following drawings and specific embodiments.

Figure 1:
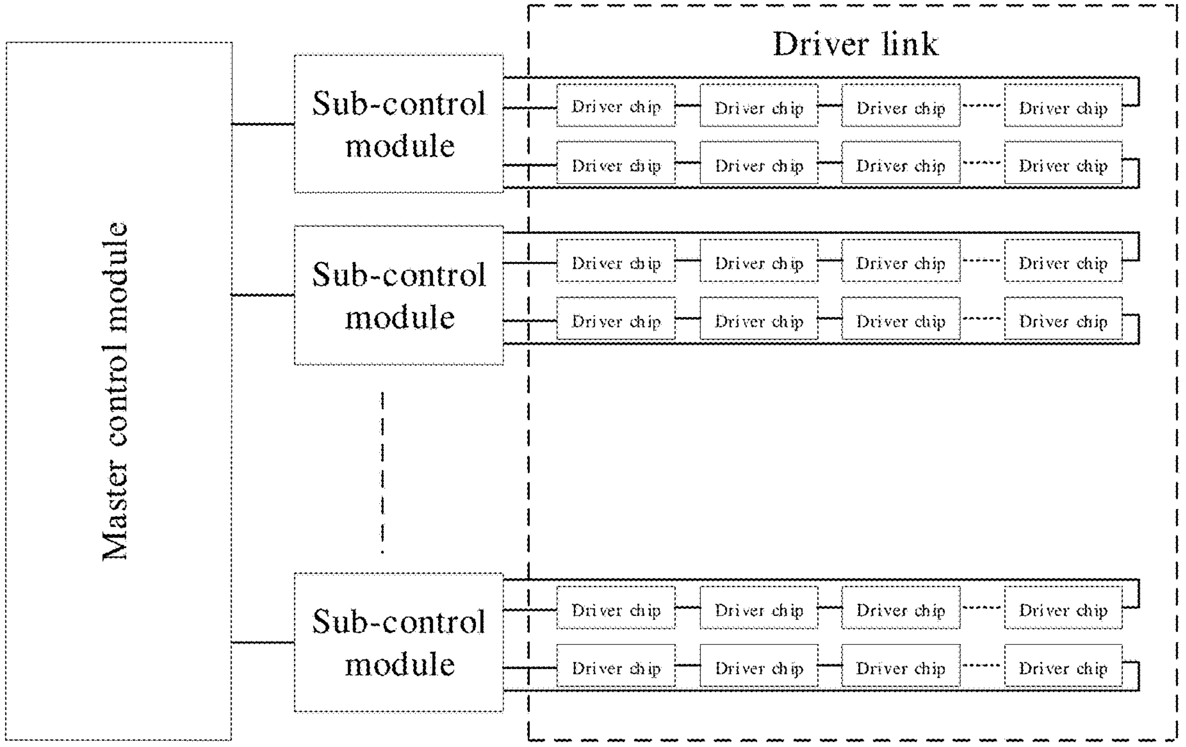
FIG. 1 is a circuit architecture diagram of a typical driver architecture in the prior art.
Figure 2:
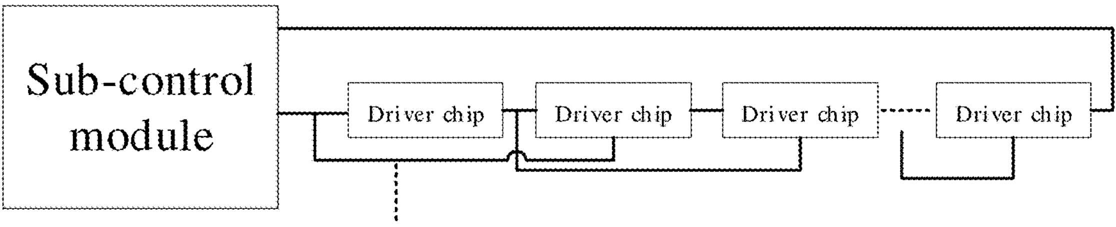
FIG. 2 is a circuit structure diagram of a crossover solution for a driver link in the prior art.

Reference signs in the drawings are as follows:

10—Main control unit

20—driver unit.

DETAILED DESCRIPTION OF PREFERRED EMBODIMENTS

The technical solutions in the embodiments of the present application will be clearly and completely described below with reference to the drawings in the embodiments of this application. Obviously, the described embodiments are merely part of the embodiments of this application, not all of them. Based on the embodiments in this application, all other embodiments obtained by those of ordinary skill in the art without creative effort belong to the protection scope of this application. The terms "first", "second", "third", "forth" and so on (if any) in the specification and claims of this application, as well as the drawings, are intended to identify similar features rather than to define a specific order or sequence. It should be appreciated that the data so used can be interchanged in appropriate conditions, allowing the embodiments described herein to be implemented in different orders than those illustrated or described herein. Furthermore, the terms "comprise" and "include" and their derivatives relate to inclusive or open-ended scope and do not exclude additional, unrecited elements. For example, a process, method, system, product, or equipment that includes a sequence of steps or units is not limited to those specifically specified, but may also include other steps or units that are not explicitly listed or are inherent in such processes, methods, products, or equipment.

Before introducing the embodiments of the present application, a brief explanation of the design concept is provided:

In a single-wire series circuit, the main control unit outputs an address-assignment command to the first driver unit. Since the driver units are connected in a sequential series structure, each driver unit receives the address-assignment command from the previous adjacent driver unit, completes its address configuration, and then outputs the command to the next adjacent driver unit. During the process in which the address-assignment command is sequentially transmitted from the first driver unit to the N-th driver unit, the addressing of all driver units is completed. (Introduce detailed work application scenarios). If a disconnection point exists in the series circuit, the driver chips located after the disconnection point will be unable to receive address assignments and communicate properly. The causes of such disconnection points include, but are not limited to, chip failure, circuit aging, and other factors. The key to restoring normal addressing and communication for the driver chips after the disconnection point lies in accurately determining the position of the disconnection point.

Figure 3:
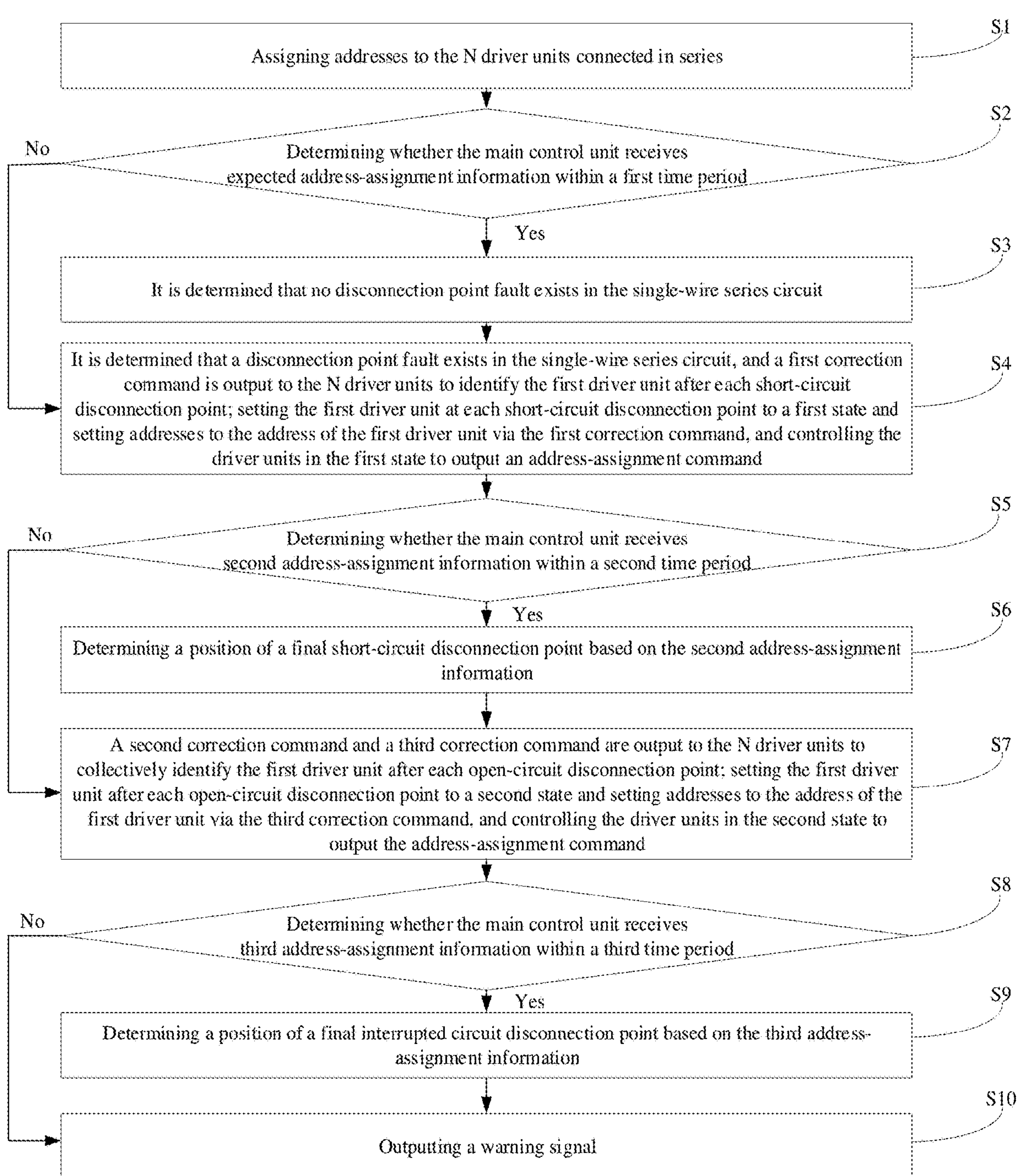
FIG. 3 is the first flowchart of the disconnection point detection method for single-wire series circuits provided by the first embodiment of the present application.

Please refer to FIG. 3. Based on the above, the first embodiment of the present application proposes a disconnection point detection method for single-wire series circuits, which is used to detect the presence of disconnection points in a single-wire series circuit; wherein the single-wire series circuit includes a main control unit and N driver units, and the N driver units are connected in series; an output terminal of the main control unit is connected to an input terminal of the first driver unit, an output terminal of the N-th driver unit is connected to an input terminal of the main control unit, and a signal terminal of the main control unit is connected to each of the driver units; wherein N is a positive integer and N≥1;

the method includes the following steps:

S1: Assigning addresses to the N driver units connected in series.

S2: Determining whether the main control unit receives expected address-assignment information within a first time period; if yes, proceed to S3; if no, proceed to S4.

The expected address-assignment information is configured to represent sequential address-assignment information from the first driver unit to the N-th driver unit.

S3: It is determined that no disconnection point fault exists in the single-wire series circuit;

S4: It is determined that a disconnection point fault exists in the single-wire series circuit, and a first correction command is output to the N driver units to identify the first driver unit after each short-circuit disconnection point; setting the first driver unit at each short-circuit disconnection point to a first state and setting addresses to the address of the first driver unit via the first correction command, and controlling the driver units in the first state to output an address-assignment command.

S5: Determining whether the main control unit receives second address-assignment information within a second time period; if yes, proceed to S6; if no, proceed to S7.

S6: Determining a position of a final short-circuit disconnection point based on the second address-assignment information.

The second address-assignment information is configured to represent sequential address-assignment information from the first driver unit to the N-th driver unit at the final short-circuit disconnection point.

S7: A second correction command and a third correction command are output to the N driver units to collectively identify the first driver unit after each open-circuit disconnection point; setting the first driver unit after each open-circuit disconnection point to a second state and setting addresses to the address of the first driver unit via the third correction command, and controlling the driver units in the second state to output the address-assignment command.

S8: Determining whether the main control unit receives third address-assignment information within a third time period; if yes, proceed to S9; if no, proceed to S10.

S9: Determining a position of a final open-circuit disconnection point based on the third address-assignment information.

The third address-assignment information is configured to represent sequential address-assignment information from the first driver unit to the N-th driver unit at the final open-circuit disconnection point; and

S10: Outputting a warning signal.

The embodiment of the present application achieves disconnection detection for single-wire series circuits at a low cost through the above technical solution. The specific principle is as follows:

before explaining the principle of disconnection detection, a brief description of the types of disconnection points is provided. In a single-wire series circuit, disconnection points mainly include open-circuit disconnection points and short-circuit disconnection points. The difference between the two is that at an open-circuit disconnection point, the potential is neither pulled low nor high, so the open-circuit disconnection point remains at the default level; whereas at a short-circuit disconnection point, the potential is pulled low or high due to a short circuit to ground or power. Therefore, at an open-circuit disconnection point, the input and output terminals of subsequent driver units remain at the default level, and the address information is zero. And, at a short-circuit disconnection point, the input and output terminals of the driver units after the first driver unit are also at the default level, and their address information is zero. Only the input terminal of the first driver unit at the short-circuit disconnection point is at a low or high level, and the address information is zero.

Based on the above description, the first driver unit after the short-circuit disconnection point can be determined by analyzing the level of the input terminal and address information of the driver units. Therefore, after detecting a disconnection point fault in the single-wire series circuit, the main control unit broadcasts the first correction command to all driver units via the existing parallel bus. If a driver unit receiving the first correction command has a low input level and an address information of zero, the driver unit is identified as the first driver unit at the short-circuit disconnection point. It is then set to the first state, and the address information is set to be the same as that of the first driver unit. For example, if the first driver unit's address information is set to 2, the identified driver unit's address information is also set to 2. Additionally, this driver unit is controlled to output a configuration command to subsequent driver units for regular addressing.

If the main control unit receives the second address-assignment information within the second time period, it indicates that the final disconnection point fault is a short-circuit disconnection point, and the second address-assignment information characterizes the position of the final short-circuit disconnection point. The principle behind this is as follows: if there are other disconnection point faults before the final disconnection point, neither a short-circuit disconnection point nor an open-circuit disconnection point would allow the address-assignment command to propagate sequentially. For example, if another short-circuit disconnection point exists before the final disconnection point, the address-assignment command output by the corresponding first driver unit at the disconnection point would be interrupted at the final disconnection point. Similarly, if an open-circuit disconnection point exists before the final disconnection, the first driver unit corresponding to the open-circuit disconnection point would not respond to the first correction command. Therefore, only when the final disconnection point is a short-circuit disconnection point will the corresponding first driver unit respond to the first correction command and output the address-assignment command, allowing the main control unit to receive the second address-assignment information. By subtracting the second address-assignment information from the expected address-assignment information, the main control unit can determine the position of the final short-circuit disconnection point.

If the main control unit does not receive the second address-assignment information within the second time period, it indicates that the final disconnection point fault is not a short-circuit disconnection point, and the final disconnection point fault may be an open-circuit disconnection point. In this case, the main control unit first broadcasts the second correction command to all driver units via the existing parallel bus. If a driver unit receiving the second correction command has an address information of zero, the driver unit is set to the third state, and the serial output terminal is set to a low level. As explained above, the input and output terminals of the driver units following the open-circuit disconnection point are at a high level. Therefore, by setting the serial output terminals of the driver units following the open-circuit disconnection point to a low level, only the first driver unit at the open-circuit disconnection point will have its input terminal at a high level. The main control unit then broadcasts the third correction command to all driver units via the existing parallel bus. If a driver unit receiving the third correction command has a high input level, an address information of zero, and is in the third state, the driver unit is identified as the first driver unit at the open-circuit disconnection point. It is set to the second state, and its address information is set to be the same as that of the first driver unit. For example, if the first driver unit's address information is set to 3, the address information of the identified driver unit is also set to 3. Additionally, the driver unit is controlled to output configuration commands to subsequent driver units for regular addressing.

If the main control unit receives the third address-assignment information within the third time period, it indicates that the final disconnection point fault is an open-circuit disconnection point. The third address-assignment information is used to characterize the position of the final open-circuit disconnection point. The principle is similar to that of the final short-circuit disconnection point and will not be repeated here. The main control unit can calculate the position of the final open-circuit disconnection point by subtracting the third address-assignment information from the expected address-assignment information. If the main control unit does not receive the third address-assignment information within the third time period, it indicates that there is another fault in the single-wire series circuit, aside from the disconnection point fault, that cannot be detected. In this case, a warning signal shall be output.

Compared with existing methods for detecting disconnection points in single-wire series circuits, the embodiment of the present application does not require adding additional backup pins to each driver unit. Instead, it uses the existing parallel bus and serial structure to achieve the disconnection point fault detection, thereby reducing the packaging cost of the single-wire series circuit and significantly lowering the packaging cost of the driver architecture. Meanwhile, this embodiment eliminates the need for routing additional backup pins, thus simplifying the routing of the driver architecture and reducing PCB costs. In addition to detecting the position of the disconnection point, this embodiment also controls the first driver unit at each short-circuit disconnection point through the first correction command to output an address-assignment command, thereby restoring normal addressing for subsequent driver units.

From the principle of the final short-circuit disconnection point described above, it is evident that the disconnection point detection method for single-wire series circuits is only applicable to detect the position of the final disconnection point. It cannot detect the disconnection points before the final one. Furthermore, chips before the first disconnection point and after the final disconnection point can be properly addressed, but chips between the first and final disconnection points, or chips that are damaged, cannot be correctly addressed.

The specific steps of the disconnection point detection method for single-wire series circuits are explained as follows:

In a specific implementation, in step S2, the control unit determines whether it receives the expected address-assignment information within the first time period. This specifically includes: after the control unit outputs the address-assignment command, if it receives the expected address-assignment information within the first time period, it indicates that there is no disconnection point fault or other communication-affecting faults in the single-wire series circuit, and the system is functioning normally. If the control unit does not receive the expected address-assignment information within the first time period, it indicates that there is a disconnection point fault or other communication-affecting faults in the single-wire series circuit.

The expected address-assignment information is used to represent the address-assignment information from the first driver unit to the N-th driver unit. For example, in a single-wire cascaded circuit with 6 driver units connected in series, the address information of the first driver unit is set to 1, and the address information of the subsequent driver units is incremented by one. Thus, the expected address-assignment information equals the address information of the 6th driver unit, i.e., 6.

The first time period can be set between 100 μS and 200 μS to avoid misjudgment of faults due to signal transmission delays. Apparently, the first time period can also be set to a broader range beyond the specified range. The specific time can be selected based on the needs, and there is no specific limitation.

Figure 4:
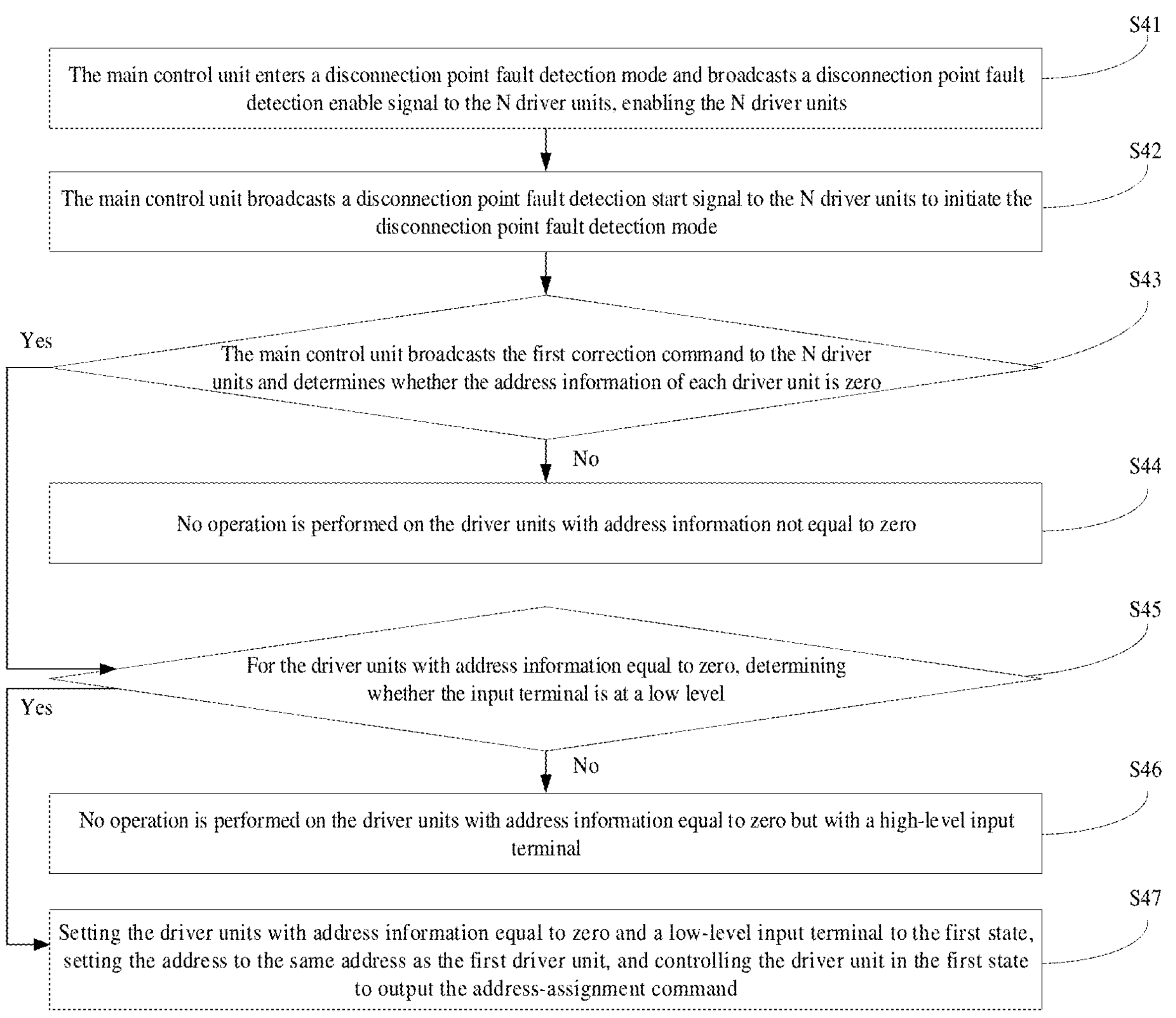
FIG. 4 is the second flowchart of the disconnection point detection method for single-wire series circuits provided by the first embodiment of the present application.

With reference to FIG. 4, as a specific embodiment, S4 specifically includes the following steps:

S41: The main control unit enters a disconnection point fault detection mode and broadcasts a disconnection point fault detection enable signal to the N driver units, enabling the N driver units.

S42: The main control unit broadcasts a disconnection point fault detection start signal to the N driver units to initiate the disconnection point fault detection mode.

S43: The main control unit broadcasts the first correction command to the N driver units and determines whether the address information of each driver unit is zero; if no, proceed to S44; if yes, proceed to S45.

S44: No operation is performed on the driver units with address information not equal to zero.

S45: For the driver units with address information equal to zero, determining whether the input terminal is at a low level; if no, proceed to S46; if yes, proceed to S47.

S46: No operation is performed on the driver units with address information equal to zero but with a high-level input terminal.

In this case, the driver unit with address information equal to zero but with a high-level input indicates that this driver unit is not the first driver unit after the short-circuit disconnection point, and therefore no action is required.

S47: Setting the driver units with address information equal to zero and a low-level input terminal to the first state, setting the address to the same address as the first driver unit, and controlling the driver unit in the first state to output the address-assignment command.

In this case, the driver unit with address information equal to zero and a low-level input indicates that the driver unit is the first one after the short-circuit disconnection point. Since there may be multiple short-circuit disconnection points and the last one cannot be distinguished, the first driver unit after each short-circuit disconnection point needs to be set in the same manner.

As a specific embodiment, in S5, the main control unit determines whether it receives the second address-assignment information within the second time period, specifically including: after the main control unit outputs the first correction command, if the second address-assignment information is received within the second time period, it indicates that the final disconnection point fault in the single-wire series circuit is a short-circuit disconnection point fault. If the main control unit does not receive the second address-assignment information within the second time period, it indicates that the single-wire series circuit does not have a short-circuit disconnection point fault, or that the final disconnection point fault in the single-wire series circuit is not a short-circuit disconnection point fault but an open-circuit disconnection point fault. The specific principle has already been explained above and will not be repeated here.

The second time period can be set between 100 μS-200 μS to avoid misjudgment by the main control unit due to signal transmission delay. Apparently, in addition to the above range, the second time period can also be set to a broader range. The specific time can be selected based on actual needs and is not limited here.

The second address-assignment information is used to characterize the address-assignment information from the first driver unit at the final short-circuit disconnection point to the N-th driver unit. For example, if a single-wire cascaded circuit consists of six serially connected driver units, and the first driver unit at the final short-circuit disconnection point is the fourth driver unit with its address set to 1, then the second address-assignment information is equal to the address information of the sixth driver unit, which is 3.

On this basis, in S6, the position of the final short-circuit disconnection point is determined based on the second address-assignment information, specifically including: computing the difference between the expected address-assignment information and the second address-assignment information, and determining the position of the final short-circuit disconnection point based on the difference. Continuing with the previous example: since the second address-assignment information is 3, and the main control unit is aware that the expected address-assignment information is 6, subtracting the second address-assignment information from the expected address-assignment information reveals that the final short-circuit disconnection point is located between the third and fourth driver units. As for the cause of the final short-circuit disconnection point, it could be due to damage to the third driver unit, causing its output terminal to form a short-circuit disconnection point; or it could be caused by aging of the circuit, resulting in a short-circuit disconnection point at the output terminal of the third driver unit, while the third driver unit itself is not damaged. The specific cause depends on the actual situation and will not be further elaborated here.

Figures 5, 6:
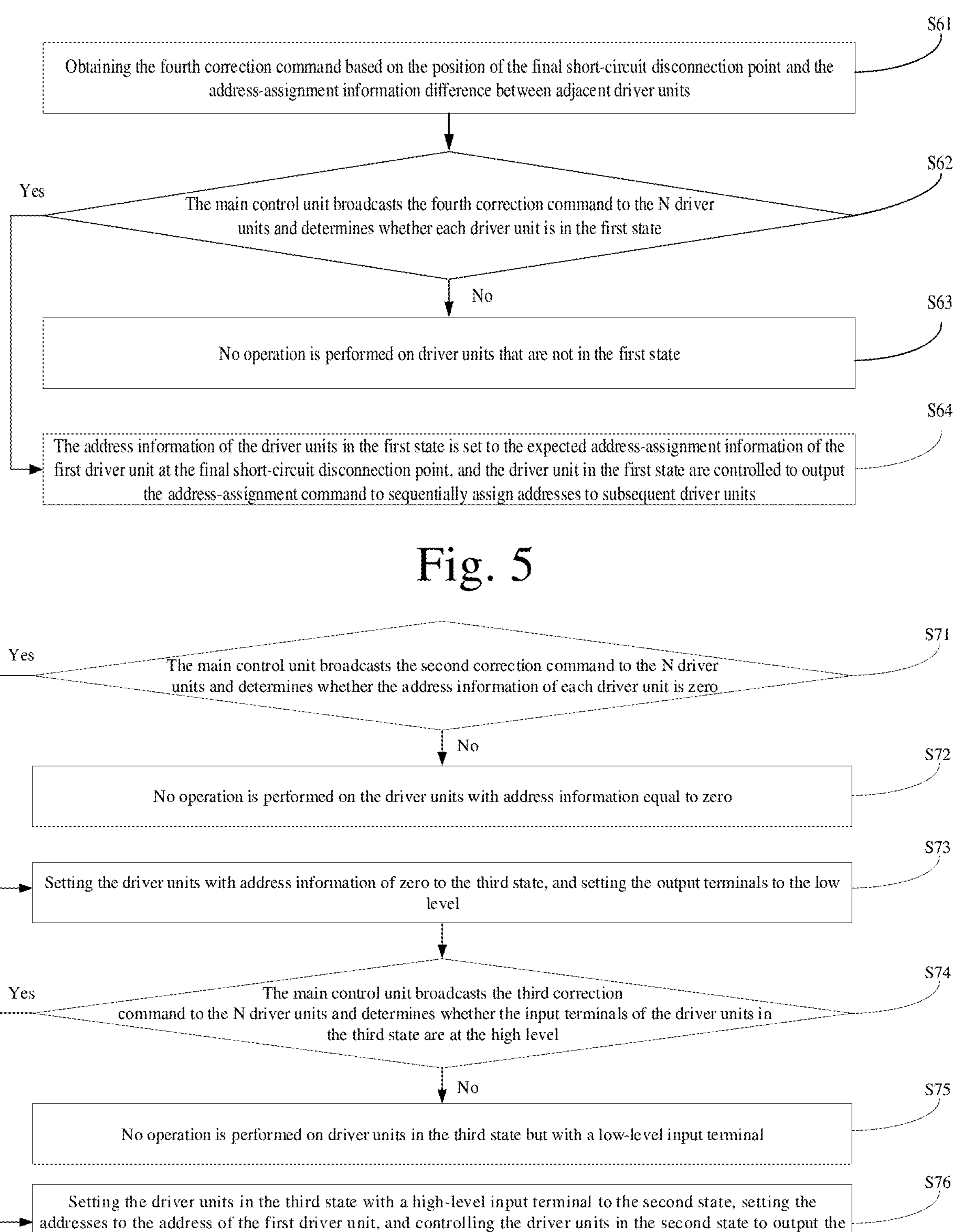
FIG. 5 is the third flowchart of the disconnection point detection method for single-wire series circuits provided by the first embodiment of the present application.
FIG. 6 is the fourth flowchart of the disconnection point detection method for single-wire series circuits provided by the first embodiment of the present application.

Please refer to FIG. 5. As a specific embodiment, after S6, the process further includes the following steps:

S61: Obtaining the fourth correction command based on the position of the final short-circuit disconnection point and the address-assignment information difference between adjacent driver units.

For example, if a single-wire cascaded circuit includes six serially connected driver units, the position of the final short-circuit disconnection point is at the output end of the third driver unit. The address information of the first adjacent driver unit is 1, and the address-assignment information difference between adjacent driver units is 2. Therefore, the expected address information of the first driver unit at the final short-circuit disconnection point (i.e., the fourth driver unit) is 7. Subsequently, the address information of the fourth driver unit is set in the fourth correction command.

S62: The main control unit broadcasts the fourth correction command to the N driver units and determines whether each driver unit is in the first state; if no, proceed to S63; if so, proceed to S64.

S63: No operation is performed on driver units that are not in the first state.

S64: The address information of the driver units in the first state is set to the expected address-assignment information of the first driver unit at the final short-circuit disconnection point, and the driver unit in the first state are controlled to output the address-assignment command to sequentially assign addresses to subsequent driver units.

If the main control unit has not yet received the expected address-assignment information of the N-th driver unit, it indicates that other communication faults exist in the single-wire series circuit, and a warning signal is output externally. If the main control unit receives the expected address-assignment information of the N-th driver unit, it indicates that the subsequent driver units after the final short-circuit disconnection point have been successfully assigned addresses. The main control unit then broadcasts a state-clear command to the N driver units to clear the first state of all driver units.

Please refer to FIG. 6. As a specific embodiment, S7 includes the following steps:

S71: The main control unit broadcasts the second correction command to the N driver units and determines whether the address information of each driver unit is zero; if no, proceed to S72; if yes, proceed to S73.

S72: No operation is performed on the driver units with address information equal to zero.

S73: Setting the driver units with address information of zero to the third state, and setting the output terminals to the low level.

S74: The main control unit broadcasts the third correction command to the N driver units and determines whether the input terminals of the driver units in the third state are at the high level; if no, proceed to S75; if yes, proceed to S76.

S75: No operation is performed on driver units in the third state but with a low-level input terminal.

If a driver unit is in the third state but its input terminal is at a low level, it indicates that the driver unit is not the first driver unit at the open-circuit disconnection point and does not require further processing.

S76: Setting the driver units in the third state with a high-level input terminal to the second state, setting the addresses to the address of the first driver unit, and controlling the driver units in the second state to output the address-assignment command.

Since the serial output terminals of driver units in the third state are all set to a low level, the driver unit in the third state with a high-level input terminal is the first driver unit at the open-circuit disconnection point. Additionally, there may be multiple open-circuit disconnection points, and it is not possible to distinguish the final open-circuit disconnection point. Therefore, the first driver unit at each open-circuit disconnection point must be configured in the same manner.

In a specific implementation, step S8 of determining whether the main control unit receives third address-assignment information within a third time period specifically includes: after the main control unit outputs the third correction command; if the third address-assignment information is received within the third time period, it indicates that the final disconnection point fault in the single-wire series circuit is an open-circuit disconnection point fault. If the main control unit does not receive the third address-assignment information within the third time period, it indicates that the single-wire series circuit has neither a short-circuit disconnection point fault nor an open-circuit disconnection point fault. Instead, there is another type of fault other than a disconnection point fault. Therefore, a warning signal needs to be output to indicate the issue.

The third time period can be set within a range of 100 μS to 200 μS to prevent the main control unit from misjudging the fault due to signal transmission delay. Apparently, the third time period can also be set to a broader range beyond this. The specific duration can be selected based on requirements and is not limited herein.

The third address-assignment information characterizes the address-assignment information from the first driver unit to the N-th driver unit at the final open-circuit disconnection point.

On this basis, step S9 of determining a position of a final open-circuit disconnection point based on the third address-assignment information is similar to S6 and will not be repeated here.

Figure 7:
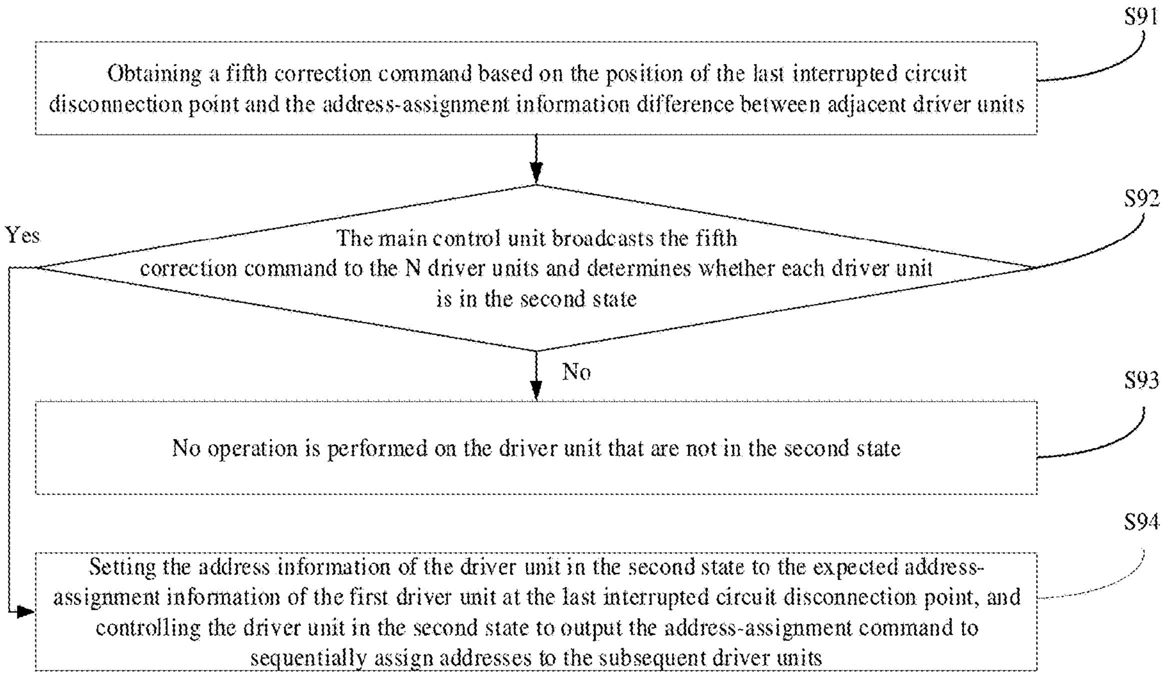
FIG. 7 is the fifth flowchart of the disconnection point detection method for single-wire series circuits provided by the first embodiment of the present application.

Please refer to FIG. 7. In a specific implementation, after S9, the following steps are also included:

S91: Obtaining a fifth correction command based on the position of the final open-circuit disconnection point and the address-assignment information difference between adjacent driver units.

For example, a single-wire cascaded circuit includes six serially connected driver units. The position of the final open-circuit disconnection point is at the output terminal of the third driver unit. The address information of the first adjacent driver unit is 1, and the address-assignment information difference between adjacent driver units is 2. Therefore, the expected address information of the first driver unit (i.e., the fourth driver unit) at the final disconnection point, is 7. Then, the address information of the fourth driver unit is set in the fifth correction command.

S92: The main control unit broadcasts the fifth correction command to the N driver units and determines whether each driver unit is in the second state; if no, proceed to S93; if yes, proceed to S94.

S93: No operation is performed on the driver unit that are not in the second state.

S94: Setting the address information of the driver unit in the second state to the expected address-assignment information of the first driver unit at the final open-circuit disconnection point, and controlling the driver unit in the second state to output the address-assignment command to sequentially assign addresses to the subsequent driver units.

If the main control unit has not yet received the expected address-assignment information of the N-th driver unit, it indicates that there are still other communication faults in the single-wire series circuit, and a warning signal is output. If the main control unit receives the expected address-assignment information of the N-th driver unit, it indicates that the subsequent driver units at the final open-circuit disconnection point have been successfully assigned addresses. The main control unit then broadcasts a state-clear command to the N driver units to clear the second state of all driver units.

Figure 8:
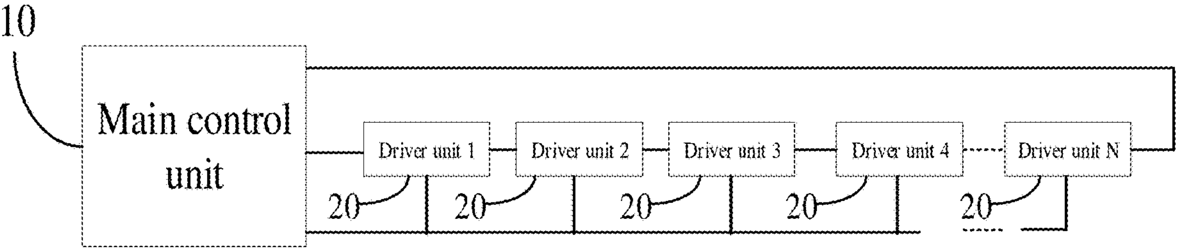
FIG. 8 is a circuit structure diagram of the single-wire series circuit provided by the second embodiment of the present application.

Please refer to FIG. 8. The second embodiment of the present application provides a single-wire series circuit, which includes:

a main control unit 10 and N driver units 20, and the N driver units 20 connected in series; an output terminal of the main control unit 10 is connected to an input terminal of the first driver unit, an output terminal of the N-th driver unit 20 is connected to an input terminal of the main control unit 10, and a parallel signal terminal of the main control unit 10 is connected to each of the driver units 20; where N is a positive integer and N≥1; wherein, the main control unit 10 is configured for:

assigning addresses to the N driver units 20 connected in series;

determining whether the main control unit 10 receives expected address-assignment information within a first time period; if yes, it is determined that no disconnection point fault exists in the single-wire series circuit; if no, it is determined that a disconnection point fault exists in the single-wire series circuit, and a first correction command is output to the N driver units 20 to identify the first driver unit 20 after each short-circuit disconnection point; setting the first driver unit 20 at each short-circuit disconnection point to a first state and setting addresses to the address of the first driver unit 20 via the first correction command, and controlling the driver units 20 in the first state to output an address-assignment command; wherein the expected address-assignment information is configured to represent address-assignment information from the first driver unit 20 to the N-th driver unit;

determining whether the main control unit 10 receives second address-assignment information within a second time period; if the second address-assignment information is received, determining a position of a final short-circuit disconnection point based on the second address-assignment information; wherein the second address-assignment information is configured to represent address-assignment information from the first driver unit 20 to the N-th driver unit 20 at the final short-circuit disconnection point;

if the second address-assignment information is not received, a second correction command and a third correction command are output to the N driver units 20 to collectively identify the first driver unit 20 after each open-circuit disconnection point; setting the first driver unit 20 after each open-circuit disconnection point to a second state and setting addresses to the address of the first driver unit 20 via the third correction command, and controlling the driver units 20 in the second state to output the address-assignment command;

determining whether the main control unit 10 receives third address-assignment information within a third time period; if the third address-assignment information is received, determining a position of a final open-circuit disconnection point based on the third address-assignment information; wherein the third address-assignment information is configured to represent sequential address-assignment information from the first driver unit 20 to the N-th driver unit 20 at the final open-circuit disconnection point; and if the third address-assignment information is not received, a system outputs a warning signal.

The third embodiment of the present application provides a driver architecture, which includes: M single-wire series circuits of claim 10; wherein M is a positive integer and M≥1.

Finally, it should be noted that the above embodiments are provided solely to illustrate the technical solutions of the present application and not to limit them. Although the present application has been described in detail with reference to the foregoing embodiments, those skilled in the art should understand that modifications can still be made to the technical solutions described in these embodiments, or some or all of the technical features can be equivalently replaced. Such modifications or replacements do not depart from the essence of the corresponding technical solutions within the scope of the embodiments of the present application.

What is claimed is:

1. A disconnection point detection method for single-wire series circuits, used to detect a disconnection point present in a single-wire series circuit; wherein the single-wire series circuit comprises a main control unit and N driver units, and the N driver units are connected in series; an output terminal of the main control unit is connected to an input terminal of the first driver unit, an output terminal of the N-th driver unit is connected to an input terminal of the main control unit, and a signal terminal of the main control unit is connected to each of the driver units; wherein N is a positive integer and N≥1;

the method is characterized by comprising the following steps:

assigning addresses to the N driver units connected in series;

determining whether the main control unit receives expected address-assignment information within a first time period; if yes, it is determined that no disconnection point fault exists in the single-wire series circuit; if no, it is determined that a disconnection point fault exists in the single-wire series circuit, and a first correction command is output to the N driver units to identify the first driver unit after each short-circuit disconnection point; setting the first driver unit at each short-circuit disconnection point to a first state and setting addresses to the address of the first driver unit via the first correction command, and controlling the driver units in the first state to output an address-assignment command; wherein the expected address-assignment information is configured to represent sequential address-assignment information from the first driver unit to the N-th driver unit;

determining whether the main control unit receives second address-assignment information within a second time period; if the second address-assignment information is received, determining a position of a final short-circuit disconnection point based on the second address-assignment information; wherein the second address-assignment information is configured to represent sequential address-assignment information from the first driver unit to the N-th driver unit at the final short-circuit disconnection point;

if the second address-assignment information is not received, the single-wire series circuit does not have a short-circuit disconnection point fault, and a second correction command and a third correction command are output to the N driver units to collectively identify the first driver unit after each open-circuit disconnection point; setting the first driver unit after each open-circuit disconnection point to a second state and setting addresses to the address of the first driver unit via the third correction command, and controlling the driver units in the second state to output the address-assignment command;

determining whether the main control unit receives third address-assignment information within a third time period; if the third address-assignment information is received, determining a position of a final open-circuit disconnection point based on the third address-assignment information; wherein the third address-assignment information is configured to represent sequential address-assignment information from the first driver unit to the N-th driver unit at the final open-circuit disconnection point; and if the third address-assignment information is not received, a system outputs a warning signal, indicating that multiple faults exist in the system.

2. The disconnection point detection method for single-wire series circuits of claim 1, wherein before the main control unit addresses the N driver units, the method further comprises: powering on the single-wire series circuit and sending a correction command via a parallel bus to realize disconnection point repair.

3. The disconnection point detection method for single-wire series circuits of claim 1, wherein the step of determining a position of a final short-circuit disconnection point based on the second address-assignment information comprises:

subtracting the address-assignment information in the second address-assignment information from the address-assignment information in the expected address-assignment information to obtain a first position; and determining a specific position of the final short-circuit disconnection point based on the first position.

4. The disconnection point detection method for single-wire series circuits of claim 3, wherein, after the step of determining a position of a final short-circuit disconnection point based on the second address-assignment information, the method further comprises:

sequentially addressing subsequent driver units at the final short-circuit disconnection point according to the expected address-assignment information, based on the position of the final short-circuit disconnection point and an address-assignment information difference between adjacent driver units.

5. The disconnection point detection method for single-wire series circuits of claim 4, wherein, the step of sequentially addressing the subsequent driver units at the final short-circuit disconnection point according to the expected address-assignment information, based on the position of the final short-circuit disconnection point and an address-assignment information difference between adjacent driver units specifically comprises:

obtaining a fourth correction command based on the position of the final short-circuit disconnection point and the address-assignment information difference between adjacent driver units, and outputting it to N driver units; wherein the fourth correction command is configured to address the driver unit in the first state according to the expected address-assignment information of the first driver unit at the final short-circuit disconnection point; and controlling the driver unit in the first state to output the address-assignment command to sequentially address the subsequent driver units.

6. The disconnection point detection method for single-wire series circuits of claim 5, wherein, if the expected address-assignment information is received, a state-clear command is sent to the N driver units to clear the first state of the driver unit and clear the second state of the driver unit; if the expected address-assignment information is not received, the warning signal is output externally.

7. The disconnection point detection method for single-wire series circuits of claim 1, wherein the step of determining a position of a final open-circuit disconnection point based on the third address-assignment information comprises:

subtracting the address-assignment information in the third address-assignment information from the address-assignment information in the expected address-assignment information to obtain a second position; and determining a specific position of the final open-circuit disconnection point based on the second position.

8. The disconnection point detection method for single-wire series circuits of claim 7, wherein, after the step of determining a position of a final open-circuit disconnection point based on the third address-assignment information, the method further comprises:

sequentially addressing subsequent driver units at the final open-circuit disconnection point according to the expected address-assignment information, based on the position of the final open-circuit disconnection point and an address-assignment information difference between adjacent driver units.

9. The disconnection point detection method for single-wire series circuits of claim 8, wherein, the step of sequentially addressing the subsequent driver units at the final open-circuit disconnection point according to the expected address-assignment information, based on the position of the final open-circuit disconnection point and an address-assignment information difference between adjacent driver units specifically comprises:

obtaining a fifth correction command based on the position of the final open-circuit disconnection point and the address-assignment information difference between adjacent driver units, and outputting it to N driver units; wherein the fifth correction command is configured to address the driver unit in the second state according to the expected address-assignment information of the first driver unit at the final open-circuit disconnection point; and controlling the driver unit in the second state to output the address-assignment command to sequentially address the subsequent driver units.

10. The disconnection point detection method for single-wire series circuits of claim 9, wherein, if the expected address-assignment information is received, a state-clear command is sent to the N driver units to clear the first state of the driver unit and clear the second state of the driver unit; if the expected address-assignment information is not received, the warning signal is output externally.

11. A single-wire series circuit, comprising:

a main control unit and N driver units, and the N driver units connected in series; an output terminal of the main control unit is connected to an input terminal of the first driver unit, an output terminal of the N-th driver unit is connected to an input terminal of the main control unit, and a parallel signal terminal of the main control unit is connected to each of the driver units; where N is a positive integer and N≥1; wherein, the main control unit is configured for:

assigning addresses to the N driver units connected in series;

determining whether the main control unit receives expected address-assignment information within a first time period; if yes, it is determined that no disconnection point fault exists in the single-wire series circuit; if no, it is determined that a disconnection point fault exists in the single-wire series circuit, and a first correction command is output to the N driver units to identify the first driver unit after each short-circuit disconnection point; setting the first driver unit at each short-circuit disconnection point to a first state and setting addresses to the address of the first driver unit via the first correction command, and controlling the driver units in the first state to output an address-assignment command; wherein the expected address-assignment information is configured to represent address-assignment information from the first driver unit to the N-th driver unit;

determining whether the main control unit receives second address-assignment information within a second time period; if the second address-assignment information is received, determining a position of a final short-circuit disconnection point based on the second address-assignment information; wherein the second address-assignment information is configured to represent address-assignment information from the first driver unit to the N-th driver unit at the final short-circuit disconnection point;

if the second address-assignment information is not received, a second correction command and a third correction command are output to the N driver units to collectively identify the first driver unit after each open-circuit disconnection point; setting the first driver unit after each open-circuit disconnection point to a second state and setting addresses to the address of the first driver unit via the third correction command, and controlling the driver units in the second state to output the address-assignment command;

determining whether the main control unit receives third address-assignment information within a third time period; if the third address-assignment information is received, determining a position of a final open-circuit disconnection point based on the third address-assignment information; wherein the third address-assignment information is configured to represent sequential address-assignment information from the first driver unit to the N-th driver unit at the final open-circuit disconnection point; and if the third address-assignment information is not received, a system outputs a warning signal.

12. A driver architecture, comprising M single-wire series circuits of claim 11; wherein M is a positive integer and M≥1.

* * * * *